(12) United States Patent
Herring et al.

(10) Patent No.: US 11,710,918 B2
(45) Date of Patent: Jul. 25, 2023

(54) CABLE RECEPTACLE CONNECTOR FOR A COMMUNICATION SYSTEM

(71) Applicant: TE Connectivity Services GmbH, Schaffhausen (CH)

(72) Inventors: Michael David Herring, Apex, NC (US); Christopher William Blackburn, Bothell, WA (US); Matthew Ryan Schmitt, Middletown, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 40 days.

(21) Appl. No.: 17/246,939

(22) Filed: May 3, 2021

(65) Prior Publication Data

US 2021/0399450 A1 Dec. 23, 2021

Related U.S. Application Data (60) Provisional application No. 63/041,599, filed on Jun. 19, 2020.

(51) Int. Cl.

| H01R 12/75 | (2011.01) |
|---|---|
| H05K 1/11 | (2006.01) |
| H01R 13/11 | (2006.01) |
| H01R 12/72 | (2011.01) |
| H01R 12/73 | (2011.01) |

(52) U.S. Cl.
CPC .......... *H01R 12/75* (2013.01); *H01R 12/721* (2013.01); *H01R 12/73* (2013.01); *H01R 13/11* (2013.01); *H05K 1/117* (2013.01)

(58) Field of Classification Search
CPC ...... H01R 12/75; H01R 12/721; H01R 12/73; H01R 13/11; H05K 1/117
USPC .................................................... 439/59, 325
See application file for complete search history.

(56) References Cited

U.S. PATENT DOCUMENTS

| 3,176,261 | A | * | 3/1965 | Greco | ................. | H01R 12/722 |
| | | | | | | 439/607.07 |
| 3,509,520 | A | * | 4/1970 | Cobban | ................ | H01R 12/721 |
| | | | | | | 439/637 |
| 4,293,179 | A | * | 10/1981 | Vonder | ................. | H01R 12/724 |
| | | | | | | 439/655 |
| 4,708,415 | A | * | 11/1987 | White | ................. | H01R 12/725 |
| | | | | | | 439/59 |

(Continued)

FOREIGN PATENT DOCUMENTS

WO    WO-2019240378 A1 * 12/2019    ............ H01R 12/58

*Primary Examiner* — Peter G Leigh (57) ABSTRACT

A communication system includes a circuit board assembly including a mating circuit board having a mating edge and a plurality of mating pads at the mating edge, the circuit board assembly having an electrical component electrically coupled to the mating circuit board. The communication system includes a cable receptacle connector removably coupled to the mating edge of the mating circuit board. The cable receptacle connector includes a connector housing having a connector cavity and a card slot. A cable extends from the connector housing. The cable receptacle connector includes signal contacts each having a mating end mated with the corresponding mating pads and a terminating end electrically connected to a cable conductor of the cable.

20 Claims, 6 Drawing Sheets

(56) References Cited

U.S. PATENT DOCUMENTS

| | | | | |
|---|---|---|---|---|
| 5,010,446 A * | 4/1991 | Scannell | ............ | G01R 31/2808 |
| | | | | 439/945 |
| 5,030,138 A * | 7/1991 | Capp | .................... | H01R 13/514 |
| | | | | 439/497 |
| 5,163,849 A * | 11/1992 | Fogg | .................... | H01R 12/596 |
| | | | | 439/497 |
| 6,152,754 A * | 11/2000 | Gerhardt | ............ | H01R 13/5224 |
| | | | | 439/948 |
| 6,243,273 B1 * | 6/2001 | Beun | .................... | H05K 7/1448 |
| | | | | 439/630 |
| 7,248,470 B2 * | 7/2007 | Chen | .................... | H01R 12/721 |
| | | | | 361/679.41 |
| 7,255,586 B2 * | 8/2007 | Okada | .................... | H05K 1/117 |
| | | | | 439/636 |
| 8,062,070 B2 * | 11/2011 | Jeon | ................... | H01R 13/6473 |
| | | | | 439/620.22 |
| 8,157,598 B2 * | 4/2012 | Niitsu | ...................... | H05K 3/32 |
| | | | | 439/620.22 |
| 8,423,695 B2 * | 4/2013 | Purwin | .................. | H05K 1/117 |
| | | | | 710/301 |
| 8,450,620 B2 * | 5/2013 | Cai | ...................... | H01R 12/721 |
| | | | | 174/250 |
| 9,033,744 B2 * | 5/2015 | Chen | .................... | H01R 12/721 |
| | | | | 439/660 |
| 9,077,124 B2 * | 7/2015 | Chen | .................... | H01R 13/665 |
| 9,172,165 B1 * | 10/2015 | Sass | ........................ | G06F 1/185 |
| 10,045,452 B2 * | 8/2018 | Terenzio | .............. | H01R 12/721 |
| 10,547,133 B1 | 1/2020 | Consoli et al. | | |
| 10,736,218 B1 | 8/2020 | Ganor et al. | | |
| 2019/0356089 A1 * | 11/2019 | Costello | ............ | H01R 13/6471 |
| 2020/0106201 A1 * | 4/2020 | Herring | ................ | H01R 12/721 |

* cited by examiner

CABLE RECEPTACLE CONNECTOR FOR A COMMUNICATION SYSTEM

CROSS REFERENCE TO RELATED APPLICATIONS

This application claims benefit to U.S. Provisional Application No. 63/041,599, filed 19 Jun. 2020, titled "CABLE RECEPTACLE CONNECTOR FOR A COMMUNICATION SYSTEM", the subject matter of which is herein incorporated by reference in its entirety.

BACKGROUND OF THE INVENTION

The subject matter herein relates generally to communication systems.

Electrical connectors are used in communication systems to transmit data signals between various components. For example, card edge connectors are used in communication systems to electrically connect components within the communication system. In some conventional communication systems, board-to-board card edge connectors are used to connect a first circuit board to a second circuit board, such as an add-in card or daughtercard to a backplane or other host circuit board. In other communication systems, cable-to-board card edge connectors are used to connect the host circuit board to another component. A pluggable cable connector is configured to be plugged into the cable-to-board card edge connector. For example, the pluggable cable connector includes a circuit card having a card edge that is plugged into the cable-to-board card edge connector to electrically connect various components. However, the cable-to-board card edge connectors occupy space on the circuit board, which increases the overall surface area of the circuit board within the communication system. Additionally, the cable-to-board card edge connectors provide additional mating interfaces along the signal paths between the various components.

A need remains for a reliable and cost effective connector for a communication system.

BRIEF DESCRIPTION OF THE INVENTION

In one embodiment, a communication system is provided including a circuit board assembly including a mating circuit board having a mating edge and a plurality of mating pads at the mating edge, the circuit board assembly having an electrical component electrically coupled to the mating circuit board. The communication system includes a cable receptacle connector removably coupled to the mating edge of the mating circuit board. The cable receptacle connector includes a connector housing having a connector cavity and a card slot open at a mating end of the connector housing to the connector cavity. The cable receptacle connector includes a cable extending from a cable end of the connector housing. The cable receptacle connector includes signal contacts arranged in the connector cavity each having a mating end and a terminating end. The mating end is mated with the corresponding mating pads at the mating edge of the mating circuit board at a separable mating interface. The terminating end is electrically connected to a cable conductor of the cable.

In an embodiment, a communication system is provided including a circuit board assembly including a mating circuit board having a mating edge and a plurality of mating pads at the mating edge, the circuit board assembly having an electrical component electrically coupled to the mating circuit board. The communication system includes a cable receptacle connector removably coupled to the mating edge of the mating circuit board. The cable receptacle connector includes a connector housing having a connector cavity and a card slot open at a mating end of the connector housing to the connector cavity. The cable receptacle connector includes an interposer circuit board arranged in the connector cavity. The cable receptacle connector includes a cable extending into the connector cavity being terminated to the interposer circuit board and extending from a cable end of the connector housing. The cable receptacle connector includes signal contacts terminated to the interposer circuit board being electrically connected to the cable extending from the interposer circuit board into the card slot for mating with the corresponding mating pads at the mating edge of the mating circuit board at a separable mating interface.

In an embodiment, a communication system is provided including a circuit board assembly including a mating circuit board having a mating edge and a plurality of mating pads at the mating edge, the circuit board assembly having an electrical component electrically coupled to the mating circuit board. The communication system includes a cable receptacle connector removably coupled to the mating edge of the mating circuit board. The cable receptacle connector includes a connector housing having a connector cavity and a card slot open at a mating end of the connector housing to the connector cavity. The cable receptacle connector includes a signal leadframe including signal contacts being stamped from a metal sheet. Each signal contact having a signal lead extending between a mating end and a terminating end. The mating end extending into the card slot for mating with the corresponding mating pads at the mating edge of the mating circuit board at a separable mating interface. The terminating end is electrically connected to a cable conductor of the cable.

DETAILED DESCRIPTION OF THE INVENTION

Figure 1:
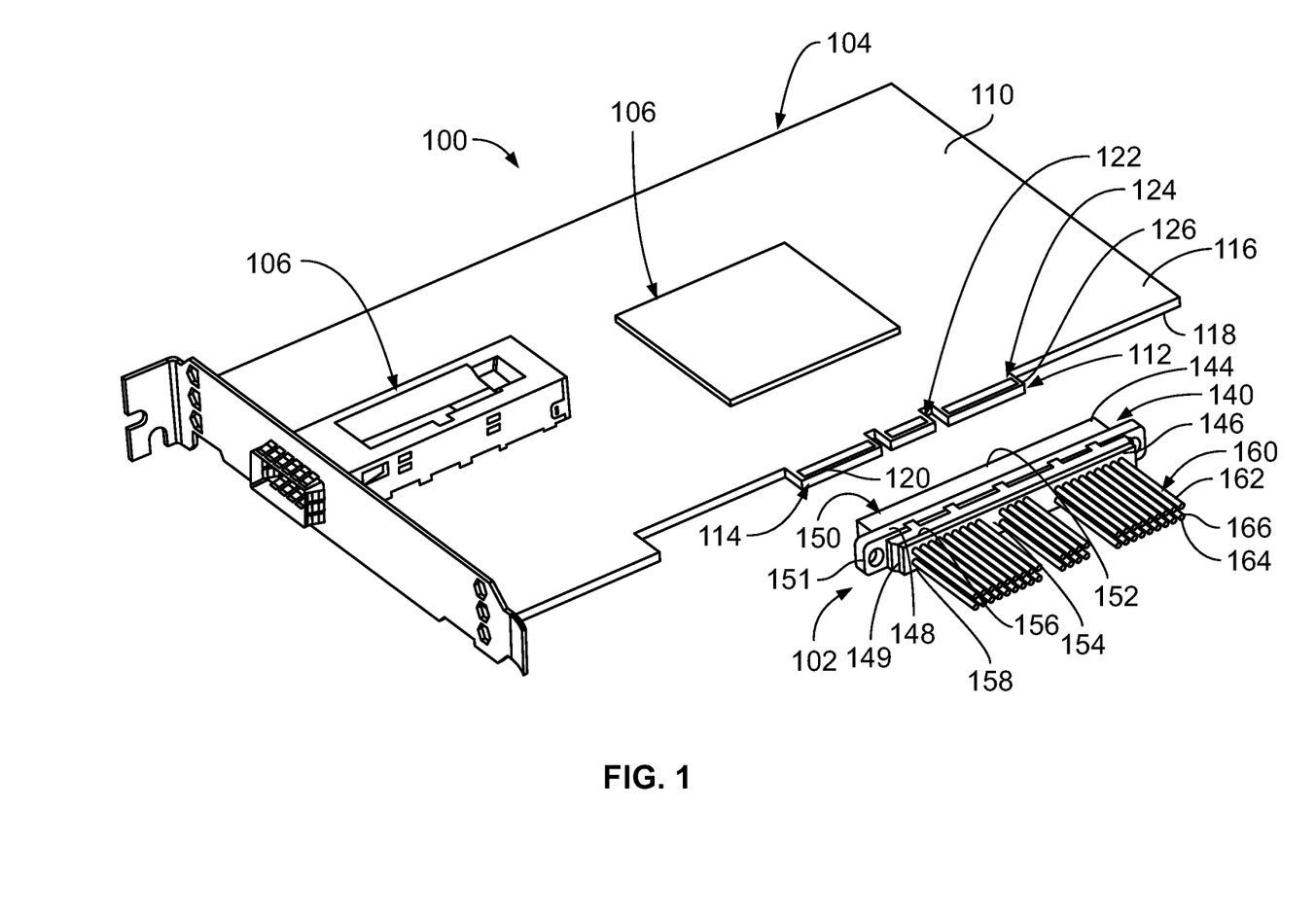
FIG. 1 is a rear perspective view of a communication system including a cable receptacle connector in accordance with an exemplary embodiment.
Figure 2:
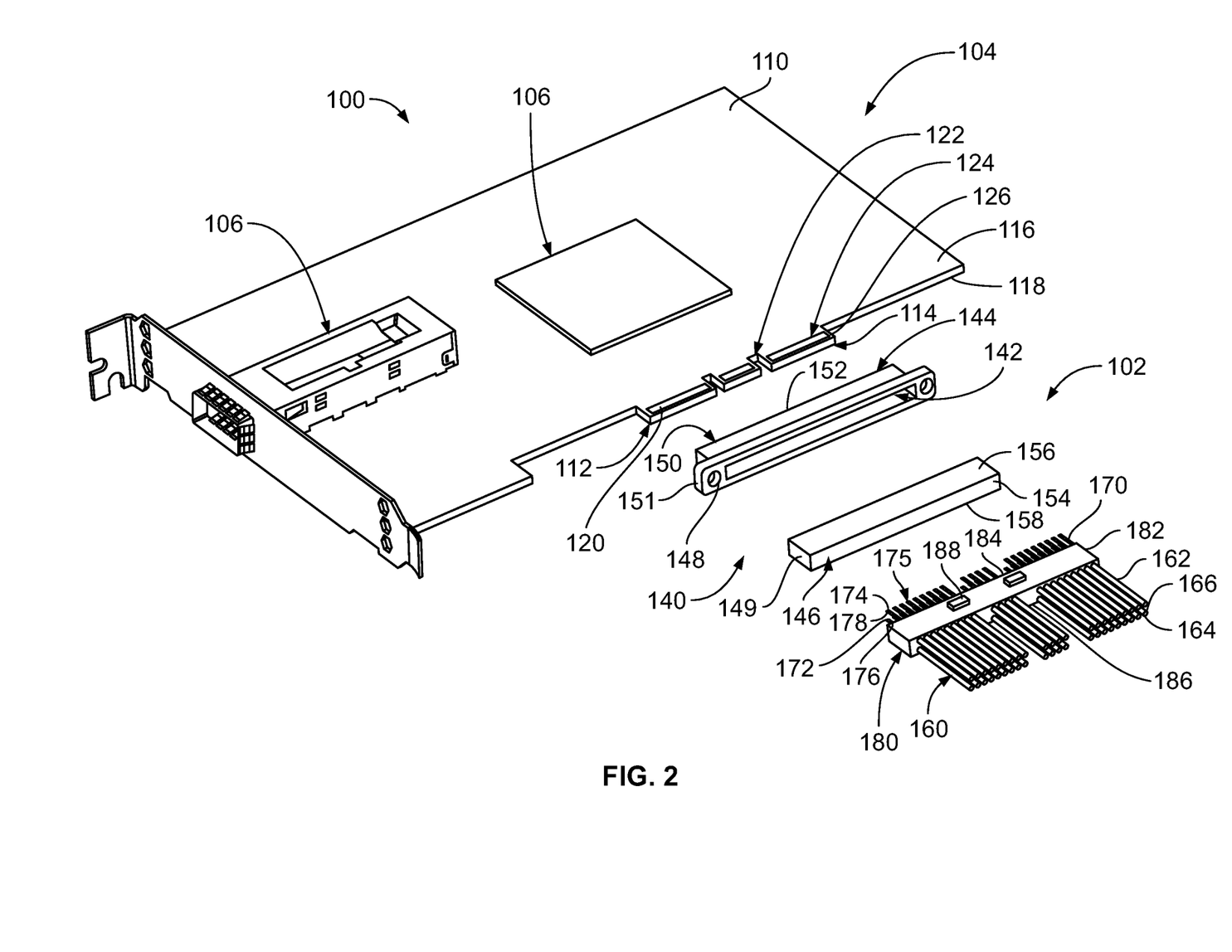
FIG. 2 is a rear perspective view of the communication system including the cable receptacle connector in accordance with an exemplary embodiment.

FIG. 1 is a rear perspective view of a communication system 100 including a cable receptacle connector 102 in accordance with an exemplary embodiment. FIG. 2 is a rear perspective view of the communication system 100 including the cable receptacle connector 102 in accordance with an exemplary embodiment. FIG. 2 illustrates the cable receptacle connector 102 in an exploded state to illustrate the components of the cable receptacle connector 102. The cable receptacle connector 102 is configured to be electrically connected with a circuit board assembly 104. In various embodiments, the circuit board assembly 104 may be fixed within the communication system 100 and the cable receptacle connector 102 is plugged onto the circuit board assembly 104. In other various embodiments, the cable receptacle connector 102 may be fixed within the communication system 100 and the circuit board assembly 104 is plugged into the cable receptacle connector 104. In the illustrated embodiment, the circuit board assembly 104 is a remote add-in card or expansion card configured to be plugged into an expansion slot of a computer or other component. The add-in card may be plugged into a motherboard, a backplane or a riser card to add functionality to the component. The circuit board assembly 104 may be a PCI-e component.

The circuit board assembly 104 includes a mating circuit board 110 configured for direct mating with the cable receptacle connector 102. In an exemplary embodiment, the mating circuit board 110 includes a card interface 112 configured to be plugged into the cable receptacle connector 102. The card interface 112 is provided at a mating edge 114 of the mating circuit board 110. The mating edge 114 is sized and shaped to plugged into the cable receptacle connector 102. In an exemplary embodiment, the mating edge 114 defines a card edge that has a standard form factor. For example, the mating edge 114 may have a common card edge interface form factor common within the data communication industry. In various embodiments, the mating edge 114 defines a card edge that has a form factor conforming with a PCI-e standard. The mating edge 114 may have other standard form factors in alternative embodiments, such as a Storage Networking Industry Association (SNIA) compliant form factor. In other various embodiments, the mating edge 114 may have a custom or non-standard form factor.

The mating circuit board 110 has a first surface 116 and a second surface 118 opposite the first surface 116. The mating circuit board 110 includes mating contact pads 120 on the first surface 116 and/or the second surface 118 at the mating edge 114. The cable receptacle connector 102 is configured to be mated to the mating contact pads 120 at the mating edge 114. The mating contact pads 120 may be formed by circuits of the mating circuit board 110. The mating contact pads 120 may be signal contact pads and/or ground contact pads and/or power contact pads.

In various embodiments, the mating circuit board 110 may include alignment slots 122 at the mating edge 114 located between card segments 124. The card segments 124 are configured to be directly plugged into the cable receptacle connector 102. The card segments 124 may include guide surfaces 126 to guide mating with the cable receptacle connector 102. The card segments 124 each have a plurality of the mating contact pads 120. The form factor of the mating edge 114 is defined, at least in part, by lengths of the card segments 124, widths of the card segments 124, locations of the alignment slots 122, widths of the alignment slots 122, number of mating contact pads 120 on the various card segments 124, and pitch of the mating contact pads 120.

In an exemplary embodiment, the circuit board assembly 104 includes one or more electrical components 106 mounted to the mating circuit board 110. The electrical components 106 may be electrically connected to the cable receptacle connector 102 via circuit traces of the circuit board assembly 104 and the mating contact pads 120. The electrical components 106 may be mounted to the first surface 116 and/or the second surface 118. Optionally, different types of electrical components 106 may be provided. In various embodiments, the electrical components 106 may include a receptacle assembly, such as an I/O assembly configured to receive an I/O transceiver module. In various embodiments, the electrical components 106 may include a processor, a memory module, or another type of network component.

In an exemplary embodiment, the circuit board assembly 104 is provided without a card edge connector for mating with a peripheral device. Rather, the cable receptacle connector 102 is directly mated with the mating edge 114 of the mating circuit board 110 to electrically connect the circuit board assembly 104 with a remote communication component. The cable receptacle connector 102 is removably coupled to the mating edge 114 of the mating circuit board 110. Direct mating of the mating edge 114 with the cable receptacle connector 102 may eliminate the need for a card edge connector, which may reduce the cost of the communication system 100. Direct mating of the mating edge 114 with the cable receptacle connector 102 may eliminate the need for a card edge connector, which may reduce mating interfaces along signal paths between the electrical components 106 and the peripheral device. Direct mating of the mating edge 114 with the cable receptacle connector 102 may eliminate the need for a card edge connector, which may reduce reduce the overall size of the mating circuit board 110 and/or providing additional surface area for mounting additional electrical component 106 to the mating circuit board 110.

The cable receptacle connector 102 includes a connector housing 140 having a connector cavity 142 extending between a mating end 144 and a cable end 146 of the connector housing 140. The connector housing 140 includes a card slot 150 at the mating end 144. The card slot 150 is sized and shaped to receive the mating edge 114 of the mating circuit board 110. For example, the mating edge 114 may be plugged directly into the card slot 150. The connector housing 140 may include alignment features configured to be received in the alignment slots 122 to guide mating of the mating edge 114 with the connector housing 140. For example, the alignment features may be walls spanning across the card slot 150. The connector housing 140 may include guide features to guide the mating edge 114 into the card slot 150. For example, the connector housing 140 may include chamfered lead ends to the card slot 150.

In an exemplary embodiment, the connector housing 140 includes a front 152 and a rear 154 opposite the front 152. The connector housing 140 includes a first side 156 and a second side 158. The first side 156 may be a top and the second side 158 may be a bottom. In the illustrated embodiment, the mating end 144 is provided at the front 152 and the cable end 146 is provided at the rear 154. Other types of connector housings may be used in alternative embodiments, such as a right angle connector housing having the cable end 146 at a right angle relative to the mating end 144, such as at the first side 156 or the second side 158.

The cable receptacle connector 102 includes one or more cables 160 extending from the cable end 146 of the connector housing 140. In various embodiments, the cable 160 includes a plurality of wires 162, which may be bundled together. In other various embodiments, the cable 160 may be a ribbon cable. The cable 160 includes a plurality of signal conductors 164 and a plurality of ground conductors 166. In various embodiments, the signal conductors 164 are defined by signal conductors of the wires 162 and the ground conductors 166 are defined by ground shields of the wires 162. For example, the wires 162 may be coaxial wires. In other various embodiments, the wires 162 may be twin-axial wires each having a pair of signal conductors and a ground shield surrounding the pair of signal conductors. Other types of wires may be used in alternative embodiments. The wires 162 may be arranged in groups or bundles. In the illustrated embodiment, the wires 162 are arranged in a first or upper row and a second or lower row.

The cable receptacle connector 102 includes signal contacts 170 (FIG. 2) arranged in the connector cavity 142. The signal contacts 170 may be coupled to the connector housing 140 and held in the connector cavity 142 by the connector housing 140. The signal contacts 170 extend into the card slot 150 for mating with the mating edge 114 of the mating circuit board 110. Each signal contact 170 has a main body 172 extending between a mating end 174 and a terminating end 176. The mating end 174 has a mating interface 178 that defines a separable mating interface for mating with the corresponding mating contact pad 120. In an exemplary embodiment, the signal contact 170 includes a mating beam 175 at the mating end 174. The mating beam 175 is deflectable and configured to be spring biased against the mating contact pad 120 to provide a mechanical and electrical connection with the mating contact pad 120. The terminating end 176 is electrically connected to the corresponding cable conductor of the cable 160. In various embodiments, the terminating end 176 may be terminated directly to the corresponding conductor of the cable 160. For example, the terminating end 176 may be soldered or crimped to the conductor. In an alternative embodiment, the cable receptacle connector 102 includes an interposer assembly 180.

The interposer assembly 180 includes an interposer circuit board 182 arranged in the connector cavity 142. The signal contacts 170 are terminated to a front edge 184 of the interposer circuit board 182. For example, the signal contacts 170 may be soldered to contact pads at the front edge 184 of the interposer circuit board 182. The signal contacts 170 may be provided at both sides of the interposer circuit board 182 in an exemplary embodiment. The signal contacts 170 extend forward of the interposer circuit board 182 for mating with the mating circuit board 110. The cable 160 extends into the connector cavity 142 and is terminated to the interposer circuit board 182 interior of the connector housing 140. For example, the signal conductors 164 may be soldered to contact pads at a rear edge 186 of the interposer circuit board 182. The signal contacts 170 are electrically connected to the signal conductors 164 of the cable 160 via circuit traces of the interposer circuit board 182. In an exemplary embodiment, the interposer circuit board 182 is arranged in the connector cavity 142 such that the front edge 184 and the rear edge 186 are interior of the connector housing 140.

In an exemplary embodiment, the interposer assembly 180 includes electronic components 188 mounted to the interposer circuit board 182. The electronic components 188 are electrically connected to the corresponding signal contacts 170, such as for affecting the signals transmitted between the cable 160 in the mating circuit board 110. Providing the electronic components 188 in the cable receptacle connector 102 eliminates the need for such electronic components on the mating circuit board 110, such as to reduce the cost of the circuit board assembly 104 and/or to reduce the size of the circuit board assembly 104. In various embodiments, the electronic components 188 may include one or more AC coupling capacitors, one or more DC blocking capacitors, one or more microcontrollers, or other electronic components.

In an exemplary embodiment, the connector housing 140 is a multipiece housing including a front housing 148 and a rear housing 149. The front housing 148 includes the card slot 150. The rear housing 149 is provided at the cable end 146. The cables 160 extend from the rear housing 149. In various embodiments, the rear housing 149 may be formed in place on the front housing 148. For example, the rear housing 149 may be overmolded around the cables 160 and the interposer circuit board 182. The rear housing 149 provide strain relief for the cables 160.

In an exemplary embodiment, the connector housing 140 includes securing features 151 used for securing the connector housing 140 to the circuit board assembly 104 and/or to another component, such as a panel, a chassis, a mounting frame or another structure. In the illustrated embodiment, the securing features 151 are mounting tabs configured to receive fasteners. Other types of securing features may be used in alternative embodiments.

The communication system 100 provides a system architecture wherein the cable connector 102 is coupled directly to the card edge interface of the mating circuit board 110 at the mating edge 114. The communication system 100 eliminates the need for a card edge connector fixedly mounted to the mating circuit board 110. The cables 160 of the cable receptacle connector 102 provide a cost effective and reliable electrical connection with a peripheral device. The cables 160 reduce circuit trace lengths between components of the communication system 100. The cable 160 provides shielded signal paths between the components of the communication system 100. The cable 160 is electrically connected to the mating circuit board 110 through the signal contacts 170 of the cable receptacle connector 102 at a separable mating interface that interfaces directly with the mating circuit board 110. The card slot 150 of the connector housing 140 is configured to directly receive the mating edge 114 of the mating circuit board 110 to electrical connect to the signal contacts 170. The signal contacts 170 are mated to the mating contact pad 120 in the card slot 150 interior of the connector housing 140. In the illustrated embodiment, the signal path between the cable conductor 164 of the cable 160 and the corresponding mating pad 120 has three mating interfaces (the first interface between the cable conductor 164 and the interposer circuit board 182, the second interface between the signal contact 170 and the interposer circuit board 182, and the third interface between the signal contact 170 and the mating pad 120), all of which are located interior of the connector housing 140.

In various embodiments, the mating circuit board 110 is fixed within the communication system 100 and the cable receptacle connector 102 is matable to and unmatable from the mating circuit board 110 without moving the mating circuit board 110 within the communication system 100. In other various embodiments, the cable receptacle connector 102 is fixed within the communication system 100 and the mating circuit board 110 is matable to and unmatable from the cable receptacle connector 102 without moving the cable receptacle connector 102 within the communication system 100.

In an exemplary embodiment, the mating circuit board 110 may be arranged adjacent additional mating circuit board(s) 114, such as in a stacked arrangement, such as at a predetermined pitch or spacing. The stacked mating circuit boards 114 may be coupled together. In an exemplary embodiment, the cable receptacle connector 102 may be arranged adjacent additional cable receptacle connector(s) 102, such as in a stacked arrangement, such as at a predetermined pitch or spacing. The cable receptacle connectors may be ganged together as a connector stack that is coupled to the mating circuit boards 114 simultaneously as a unit.

Figure 3:
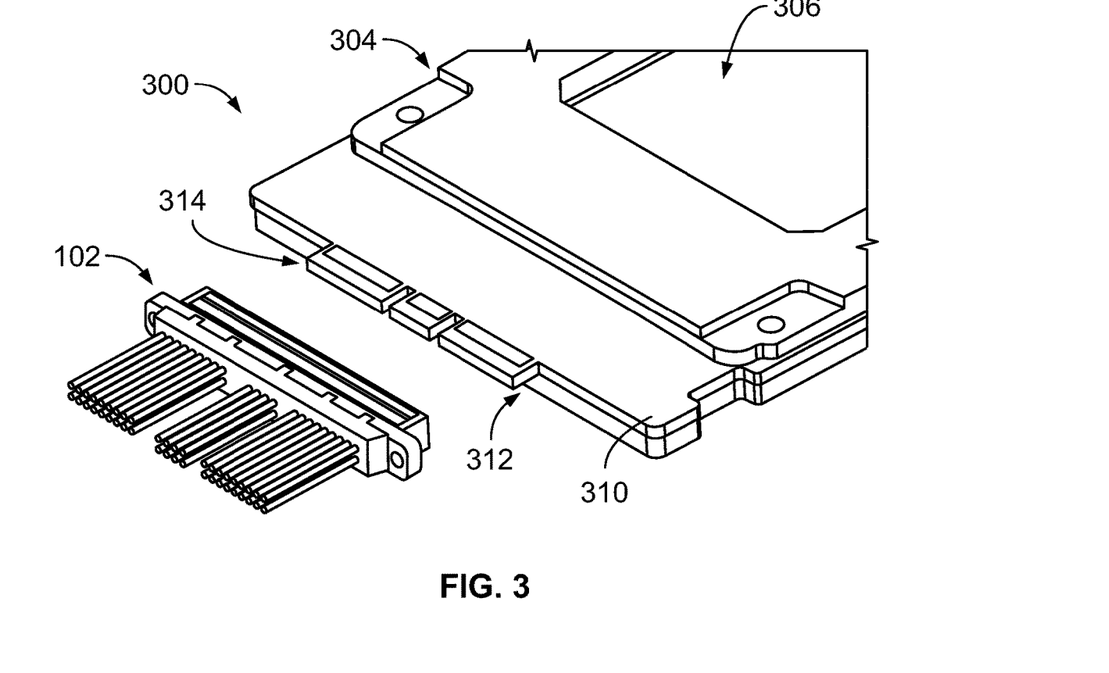
FIG. 3 is a rear perspective view of a communication system including a cable receptacle connector in accordance with an exemplary embodiment.

FIG. 3 is a rear perspective view of a communication system 300 in accordance with an exemplary embodiment. The cable receptacle connector 102 is configured to electrically connected with a circuit board assembly 304. The circuit board assembly 304 may be similar to the circuit board assembly 104 (FIG. 1) and may include similar components and/or features. In the illustrated embodiment, the circuit board assembly 304 is a compute accelerator module, such as an OAM.

The circuit board assembly 304 includes a mating circuit board 310, such as an OAM circuit board, configured for direct mating with the cable receptacle connector 102. In an exemplary embodiment, the mating circuit board 310 includes a card interface 312 configured to be plugged into the cable receptacle connector 102. The card interface 312 is provided at a mating edge 314 of the mating circuit board 310. The mating edge 314 is sized and shaped to plugged into the cable receptacle connector 102. In an exemplary embodiment, the mating edge 314 defines a card edge that has a standard form factor. In other various embodiments, the mating edge 314 may have a custom or nonstandard form factor.

In an exemplary embodiment, electrical components 306 are mounted to the mating circuit board 310. In various embodiments, the electrical components 306 may include a processor, a memory module, or another type of network component. In various embodiments, the electrical components 306 may include a socket connector.

Figure 4:
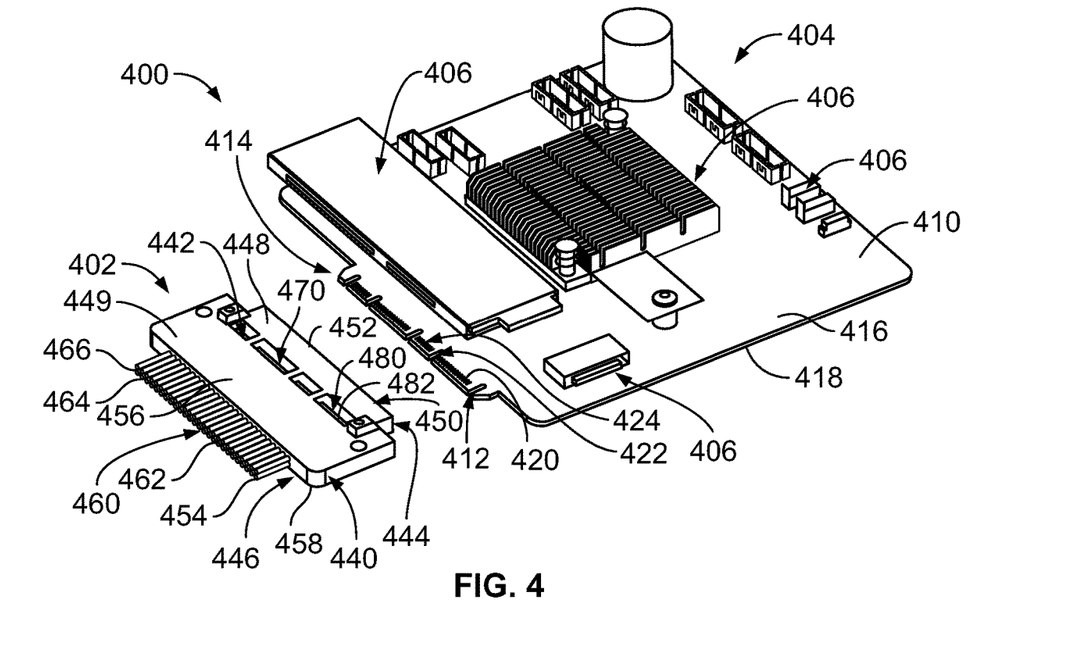
FIG. 4 is a rear perspective view of a communication system including a cable receptacle connector in accordance with an exemplary embodiment.

FIG. 4 is a rear perspective view of a communication system 400 including a cable receptacle connector 402 in accordance with an exemplary embodiment. The cable receptacle connector 402 is configured to be electrically connected with a circuit board assembly 404. The circuit board assembly 404 may be similar to the circuit board assembly 104 (FIG. 1) and may include similar components and/or features; however the circuit board assembly 404 has a different form factor and may include different electrical components 406. The cable receptacle connector 402 may be similar to the cable receptacle connector 102 (FIG. 1) and may include similar components and/or features; however the cable receptacle connector 402 has a different form factor. In various embodiments, the circuit board assembly 404 may be fixed within the communication system 400 and the cable receptacle connector 402 is plugged onto the circuit board assembly 404. In other various embodiments, the cable receptacle connector 402 may be fixed within the communication system 400 and the circuit board assembly 404 is plugged into the cable receptacle connector 404. In the illustrated embodiment, the circuit board assembly 404 is a data center secure control module (DC-SCM).

The circuit board assembly 404 includes a mating circuit board 410 configured for direct mating with the cable receptacle connector 402. In an exemplary embodiment, the mating circuit board 410 includes a card interface 412 configured to be plugged into the cable receptacle connector 402. The card interface 412 is provided at a mating edge 414 of the mating circuit board 410. The mating edge 414 is sized and shaped to be plugged into the cable receptacle connector 402. In an exemplary embodiment, the mating edge 414 defines a card edge that has a standard form factor. In other various embodiments, the mating edge 414 may have a custom or nonstandard form factor.

The mating circuit board 410 has a first surface 416 and a second surface 418 opposite the first surface 416. The mating circuit board 410 includes mating contact pads 420 on the first surface 416 and/or the second surface 418 at the mating edge 414. The cable receptacle connector 402 is configured to be mated to the mating contact pads 420 at the mating edge 414. In various embodiments, the mating circuit board 410 may include alignment slots 422 at the mating edge 414 located between card segments 424.

In an exemplary embodiment, the electrical components 406 are mounted to the mating circuit board 410. Optionally, different types of electrical components 406 may be provided. In various embodiments, the electrical components 406 may include a processor, a memory module, or another type of network component and may include a heat sink for dissipating heat from the component. In various embodiments, the electrical components 406 may include receptacle connectors. In various embodiments, the electrical components 406 may include a card edge connector for mating with a peripheral device, such as a remote SSD.

The cable receptacle connector 402 is directly mated with the mating edge 414 of the mating circuit board 410 to electrically connect the circuit board assembly 404 with a remote communication component. The cable receptacle connector 402 is removably coupled to the mating edge 414 of the mating circuit board 410. Direct mating of the mating edge 414 with the cable receptacle connector 402 may eliminate the need for a card edge connector for the cable connector.

The cable receptacle connector 402 includes a connector housing 440 having a connector cavity 442 extending between a mating end 444 and a cable end 446 of the connector housing 440. The connector housing 440 may be a multipiece housing including a front housing 448 and a rear housing 449. The connector housing 440 includes a card slot 450 at the mating end 444. The card slot 450 is sized and shaped to receive the mating edge 414 of the mating circuit board 410. In an exemplary embodiment, the connector housing 440 includes a front 452 and a rear 454 opposite the front 452. The connector housing 440 includes a first side 456 and a second side 458. In the illustrated embodiment, the mating end 444 is provided at the front 452 and the cable end 446 is provided at the rear 454.

The cable receptacle connector 402 includes one or more cables 460 extending from the cable end 446 of the connector housing 440. The cable 460 includes a plurality of wires 462, which may be bundled together. The cable 460 includes a plurality of signal conductors 464 and a plurality of ground conductors 466.

The cable receptacle connector 402 includes signal contacts 470 (one of which is shown in phantom) arranged in the connector cavity 442. The signal contacts 470 extend into the card slot 450 for mating with the mating edge 414 of the mating circuit board 410.

The cable receptacle connector 402 includes an interposer assembly 480. The interposer assembly 480 includes an interposer circuit board 482 (shown in phantom) arranged in the connector cavity 442. The cable(s) 460 extends into the connector cavity 442 and is terminated to the interposer circuit board 482. In various embodiments, the interposer assembly 480 includes electronic components mounted to the interposer circuit board 482.

The communication system 400 provides a system architecture wherein the cable connector 402 is coupled directly to the card edge interface of the mating circuit board 410 at the mating edge 414. The communication system 400 eliminates the need for a card edge connector fixedly mounted to the mating circuit board 410. The cables 460 of the cable receptacle connector 402 provide a cost effective and reliable electrical connection with a peripheral device. The cables 460 reduce circuit trace lengths between components of the communication system 400. The cable 460 provides shielded signal paths between the components of the communication system 400. The cable 460 is electrically connected to the mating circuit board 410 through the signal contacts 470 of the cable receptacle connector 402 at a separable mating interface that interfaces directly with the mating circuit board 410. The card slot 450 of the connector housing 440 is configured to directly receive the mating edge 414 of the mating circuit board 410 to electrical connect to the signal contacts 470. The signal contacts 470 are mated to the mating contact pad 420 in the card slot 450 interior of the connector housing 440. In the illustrated embodiment, the signal path between the cable conductor 464 of the cable 460 and the corresponding mating pad 420 has three mating interfaces (the first interface between the cable conductor 464 and the interposer circuit board 482, the second interface between the signal contact 470 and the interposer circuit board 482, and the third interface between the signal contact 470 and the mating pad 420), all of which are located interior of the connector housing 440.

In various embodiments, the mating circuit board 410 is fixed within the communication system 400 and the cable receptacle connector 402 is matable to and unmatable from the mating circuit board 410 without moving the mating circuit board 410 within the communication system 400. In other various embodiments, the cable receptacle connector 402 is fixed within the communication system 400 and the mating circuit board 410 is matable to and unmatable from the cable receptacle connector 402 without moving the cable receptacle connector 402 within the communication system 400.

In an exemplary embodiment, the mating circuit board 410 may be arranged adjacent additional mating circuit board(s) 414, such as in a stacked arrangement, such as at a predetermined pitch or spacing. The stacked mating circuit boards 414 may be coupled together. In an exemplary embodiment, the cable receptacle connector 402 may be arranged adjacent additional cable receptacle connector(s) 402, such as in a stacked arrangement, such as at a predetermined pitch or spacing. The cable receptacle connectors may be ganged together as a connector stack that is coupled to the mating circuit boards 414 simultaneously as a unit.

Figure 5:
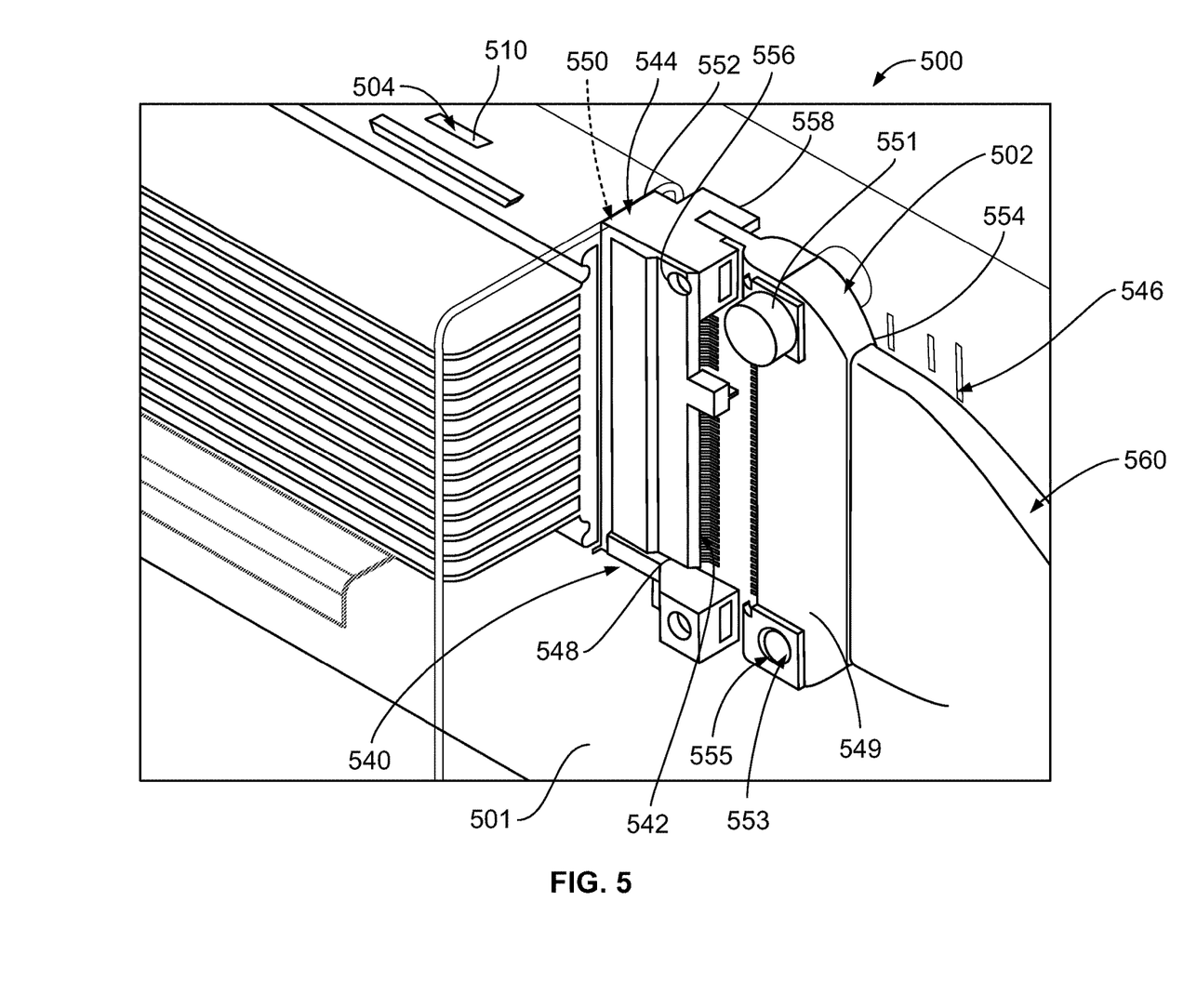
FIG. 5 is a rear perspective view of a communication system including a cable receptacle connector in accordance with an exemplary embodiment.

FIG. 5 is a rear perspective view of a communication system 500 including a cable receptacle connector 502 in accordance with an exemplary embodiment. The cable receptacle connector 502 is configured to be electrically connected with a circuit board assembly 504. The circuit board assembly 504 may be similar to the circuit board assembly 104 (FIG. 1) and may include similar components and/or features; however the circuit board assembly 504 has a different form factor and may include different electrical components 506. The cable receptacle connector 502 may be similar to the cable receptacle connector 102 (FIG. 1) and may include similar components and/or features; however the cable receptacle connector 502 has a different form factor. In the illustrated embodiments, the circuit board assembly 504 is fixed within the communication system 500, being coupled to a chassis 501, and the cable receptacle connector 502 is plugged onto the circuit board assembly 504.

The circuit board assembly 504 includes a mating circuit board 510 configured for direct mating with the cable receptacle connector 502. The cable receptacle connector 502 is configured to be directly mated with a mating edge (not shown) of the mating circuit board 510 to electrically connect the circuit board assembly 504 with a remote communication component.

The cable receptacle connector 502 includes a connector housing 540 having a connector cavity 542 extending between a mating end 544 and a cable end 546 of the connector housing 540. The cable receptacle connector 502 includes one or more cables 560 extending from the cable end 546 of the connector housing 540. The connector housing 540 may be a multipiece housing including a front housing 548 and a rear housing 549. The connector housing 540 includes a card slot 550 at the mating end 544. In an exemplary embodiment, the connector housing 540 includes a front 552 and a rear 554 opposite the front 552. The connector housing 540 includes a first side 556 and a second side 558. In an exemplary embodiment, the connector housing 540 include securing features 551, 553 for securing the connector housing 540 to the mating circuit board 510 and/or the chassis 501. In the illustrated embodiment, the securing feature 551 is a fastener, such as a threaded fastener, used to secure the connector housing 540 to the chassis 501. In the illustrated embodiment, the securing feature 553 is an opening that receives an alignment post 555 of the chassis 501 to secure the connector housing 540 to the chassis 501.

Figure 6:
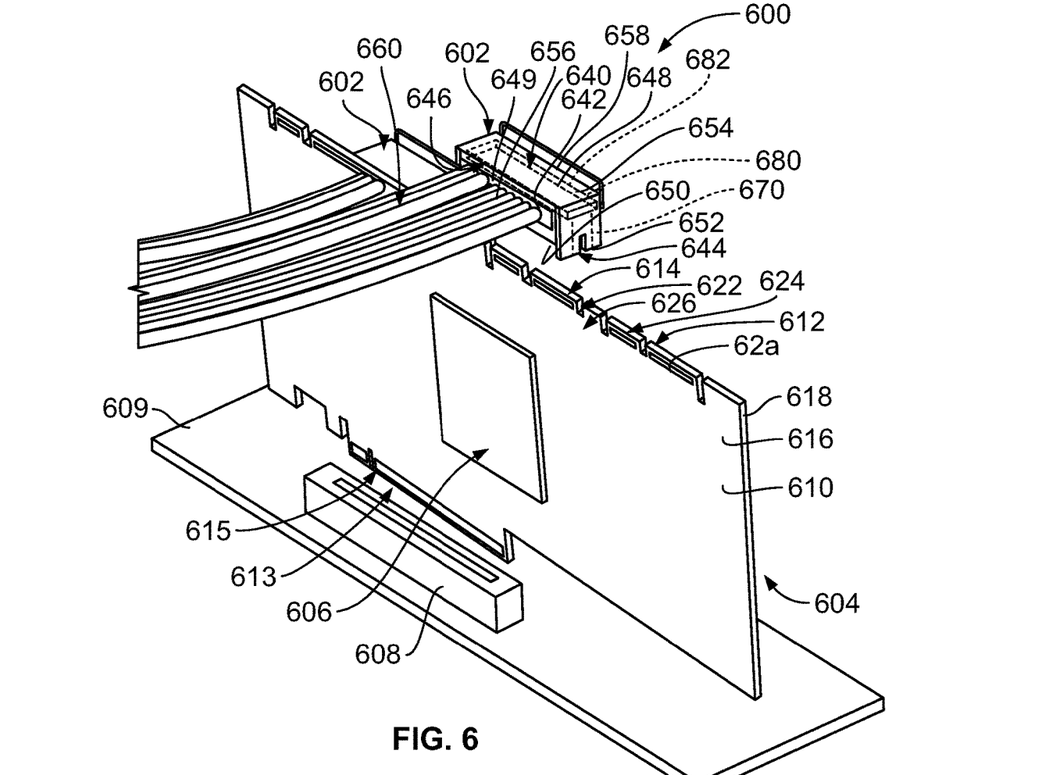
FIG. 6 is a rear perspective view of a communication system including a cable receptacle connector in accordance with an exemplary embodiment.

FIG. 6 is a rear perspective view of a communication system 600 including a cable receptacle connector 602 in accordance with an exemplary embodiment. The cable receptacle connector 602 is configured to be electrically connected with a circuit board assembly 604. The circuit board assembly 604 may be similar to the circuit board assembly 104 (FIG. 1) and may include similar components and/or features; however the circuit board assembly 604 has a different form factor and may include different electrical components 606. The cable receptacle connector 602 may be similar to the cable receptacle connector 102 (FIG. 1) and may include similar components and/or features; however the cable receptacle connector 602 has a different form factor. In various embodiments, the circuit board assembly 604 may be fixed within the communication system 600 and the cable receptacle connector 602 is plugged onto the circuit board assembly 604. In other various embodiments, the cable receptacle connector 602 may be fixed within the communication system 600 and the circuit board assembly 604 is plugged into the cable receptacle connector 604. In the illustrated embodiment, the circuit board assembly 604 is a circuit card, such as an add-in card or expansion card. The cable receptacle connector 602 may be a card to card connector assembly configured to be electrically connected between first and second circuit board assemblies 604 arranged in a stack.

The circuit board assembly 604 includes a mating circuit board 610 configured for direct mating with the cable receptacle connector 602. In an exemplary embodiment, the mating circuit board 610 includes an upper card interface 612 and a lower card interface 613. The upper card interface 612 is configured to be plugged into the cable receptacle connector 602. The card interface 612 is provided at a mating edge 614 of the mating circuit board 610. The mating edge 614 is sized and shaped to plugged into the cable receptacle connector 602. In an exemplary embodiment, the mating edge 614 defines a card edge that has a standard form factor. In other various embodiments, the mating edge 614 may have a custom or nonstandard form factor. The lower card interface 613 is configured to be plugged into a card edge connector 608 on a circuit board 609, such as a motherboard. The lower card interface 613 includes a mating edge 615 sized and shaped to plug into the card edge connector 608. In an exemplary embodiment, the mating edge 615 defines a card edge that has a standard form factor. In other various embodiments, the mating edge 615 may have a custom or nonstandard form factor.

The mating circuit board 610 has a first surface 616 and a second surface 618 opposite the first surface 616. The mating circuit board 610 includes mating contact pads 620 on the first surface 616 and/or the second surface 618 at the mating edge 614. The cable receptacle connector 602 is configured to be mated to the mating contact pads 620 at the mating edge 614. In various embodiments, the mating circuit board 610 may include alignment slots 622 at the mating edge 614 located between card segments 624. The alignment slots 622 may include latching features 626.

In an exemplary embodiment, electrical components 606 are mounted to the mating circuit board 610. In various embodiments, the electrical components 606 may include a processor, a memory module, or another type of network component. In various embodiments, the electrical components 606 may include other types of components.

The cable receptacle connector 602 is directly mated with the mating edge 614 of the mating circuit board 610 to electrically connect the circuit board assembly 604 with a remote communication component. The cable receptacle connector 602 is removably coupled to the mating edge 614 of the mating circuit board 610. Direct mating of the mating edge 614 with the cable receptacle connector 602 may eliminate the need for a card edge connector at the upper edge for the cable connector 602.

The cable receptacle connector 602 includes a connector housing 640 having a connector cavity 642 extending between a mating end 644 and a cable end 646 of the connector housing 640. The cable receptacle connector 602 includes one or more cables 660 extending from the cable end 646 of the connector housing 640. The connector housing 640 may be a multipiece housing including a front housing 648 and a rear housing 649. The connector housing 640 includes a card slot 650 at the mating end 644. The card slot 650 is sized and shaped to receive the mating edge 614 of the mating circuit board 610. In an exemplary embodiment, the connector housing 640 includes a front 652 and a rear 654 opposite the front 652. The connector housing 640 includes a first side 656 and a second side 658. In the illustrated embodiment, the connector housing 640 is a right angle connector housing with the mating end 644 provided at the front 652 and the cable end 646 provided at the first side 656.

The cable receptacle connector 602 includes signal contacts 670 (one of which is shown in phantom) arranged in the connector cavity 642. The signal contacts 670 extend into the card slot 650 for mating with the mating edge 614 of the mating circuit board 610. The signal contacts 670 are coupled to an interposer assembly 680, such as to an interposer circuit board 682 (shown in phantom) arranged in the connector cavity 642. The cable(s) 660 extends into the connector cavity 642 and is terminated to the interposer circuit board 682. In various embodiments, the interposer assembly 680 includes electronic components mounted to the interposer circuit board 682.

The communication system 600 provides a system architecture wherein the cable connector 602 is coupled directly to the card edge interface of the mating circuit board 610 at the mating edge 614. The communication system 600 eliminates the need for a card edge connector fixedly mounted to the mating circuit board 610. The cables 660 of the cable receptacle connector 602 provide a cost effective and reliable electrical connection with a peripheral device. The cables 660 reduce circuit trace lengths between components of the communication system 600. The cable 660 provides shielded signal paths between the components of the communication system 600. The cable 660 is electrically connected to the mating circuit board 610 through the signal contacts 670 of the cable receptacle connector 602 at a separable mating interface that interfaces directly with the mating circuit board 610. The card slot 650 of the connector housing 640 is configured to directly receive the mating edge 614 of the mating circuit board 610 to electrical connect to the signal contacts 670. The signal contacts 670 are mated to the mating contact pad 620 in the card slot 650 interior of the connector housing 640. In the illustrated embodiment, the signal path between the cable conductor 664 of the cable 660 and the corresponding mating pad 620 has three mating interfaces (the first interface between the cable conductor 664 and the interposer circuit board 682, the second interface between the signal contact 670 and the interposer circuit board 682, and the third interface between the signal contact 670 and the mating pad 620), all of which are located interior of the connector housing 640.

In various embodiments, the mating circuit board 610 is fixed within the communication system 600 and the cable receptacle connector 602 is matable to and unmatable from the mating circuit board 610 without moving the mating circuit board 610 within the communication system 600. In other various embodiments, the cable receptacle connector 602 is fixed within the communication system 600 and the mating circuit board 610 is matable to and unmatable from the cable receptacle connector 602 without moving the cable receptacle connector 602 within the communication system 600.

In an exemplary embodiment, the mating circuit board 610 may be arranged adjacent additional mating circuit board(s) 614, such as in a stacked arrangement, such as at a predetermined pitch or spacing. The stacked mating circuit boards 614 may be coupled together. In an exemplary embodiment, the cable receptacle connector 602 may be arranged adjacent additional cable receptacle connector(s) 602, such as in a stacked arrangement, such as at a predetermined pitch or spacing. The cable receptacle connectors may be ganged together as a connector stack that is coupled to the mating circuit boards 614 simultaneously as a unit.

Figure 7:
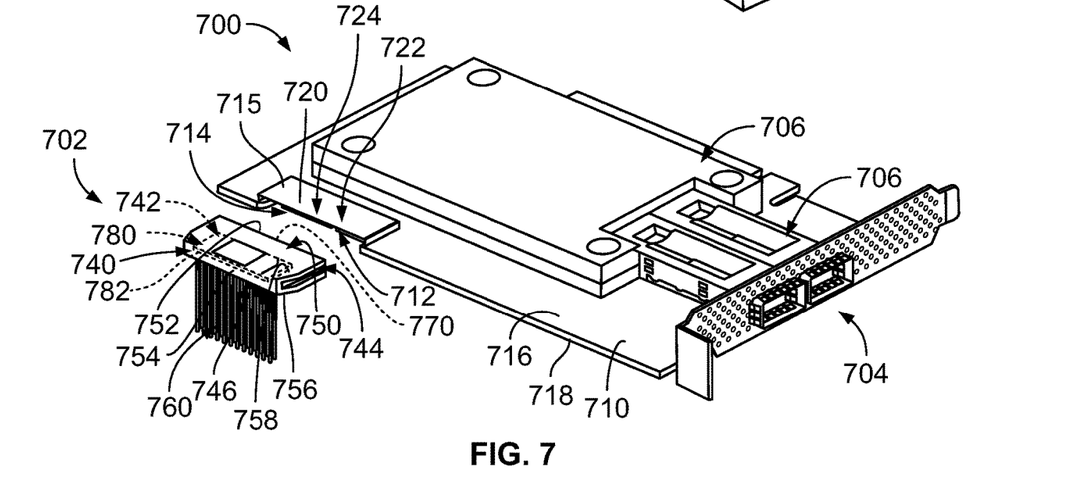
FIG. 7 is a rear perspective view of a communication system including a cable receptacle connector in accordance with an exemplary embodiment.

FIG. 7 is a rear perspective view of a communication system 700 including a cable receptacle connector 702 in accordance with an exemplary embodiment. The cable receptacle connector 702 is configured to be electrically connected with a circuit board assembly 704. The circuit board assembly 704 may be similar to the circuit board assembly 104 (FIG. 1) and may include similar components and/or features; however the circuit board assembly 704 has a different form factor and may include different electrical components 706. The cable receptacle connector 702 may be similar to the cable receptacle connector 102 (FIG. 1) and may include similar components and/or features; however the cable receptacle connector 702 has a different form factor. In various embodiments, the circuit board assembly 704 may be fixed within the communication system 700 and the cable receptacle connector 702 is plugged onto the circuit board assembly 704. In other various embodiments, the cable receptacle connector 702 may be fixed within the communication system 700 and the circuit board assembly 704 is plugged into the cable receptacle connector 704. In the illustrated embodiment, the circuit board assembly 704 is a circuit card, such as an add-in card or expansion card.

The circuit board assembly 704 includes a mating circuit board 710 configured for direct mating with the cable receptacle connector 702. In an exemplary embodiment, the mating circuit board 710 includes a card interface 712 configured to be plugged into the cable receptacle connector 702. The card interface 712 is provided at a mating edge 714 of the mating circuit board 710. The mating edge 714 is sized and shaped to plugged into the cable receptacle connector 702. In an exemplary embodiment, the mating edge 714 defines a card edge that has a standard form factor. In other various embodiments, the mating edge 714 may have a custom or nonstandard form factor. In an exemplary embodiment, the circuit board assembly 704 includes a shroud 715 coupled to the mating circuit board 710 at the mating edge 714. The shroud 715 may be conductive to provide electrical shielding for the mating edge 714.

The mating circuit board 710 has a first surface 716 and a second surface 718 opposite the first surface 716. The mating circuit board 710 includes mating contact pads 720 on the first surface 716 and/or the second surface 718 at the mating edge 714. The cable receptacle connector 702 is configured to be mated to the mating contact pads 720 at the mating edge 714. In various embodiments, the mating circuit board 710 may include alignment slots 722 at the mating edge 714 located between card segments 724.

In an exemplary embodiment, the electrical components 706 are mounted to the mating circuit board 710. Optionally, different types of electrical components 706 may be provided. In various embodiments, the electrical components 706 may include one or more receptacle assemblies, such as I/O assemblies configured to receive I/O transceiver modules. In various embodiments, the electrical components 706 may include a processor, a memory module, or another type of network component, which may have a heat sink coupled thereto.

The cable receptacle connector 702 is directly mated with the mating edge 714 of the mating circuit board 710 to electrically connect the circuit board assembly 704 with a remote communication component. The cable receptacle connector 702 is removably coupled to the mating edge 714 of the mating circuit board 710. Direct mating of the mating edge 714 with the cable receptacle connector 702 may eliminate the need for a card edge connector at the upper edge for the cable connector 702.

The cable receptacle connector 702 includes a connector housing 740 having a connector cavity 742 extending between a mating end 744 and a cable end 746 of the connector housing 740. The cable receptacle connector 702 includes one or more cables 760 extending from the cable end 746 of the connector housing 740. The connector housing 740 may be a multipiece housing. The connector housing 740 includes a card slot 750 at the mating end 744. The card slot 750 is sized and shaped to receive the mating edge 714 of the mating circuit board 710. In an exemplary embodiment, the connector housing 740 includes a front 752 and a rear 754 opposite the front 752. The connector housing 740 includes a first side 756 and a second side 758. In the illustrated embodiment, the connector housing 740 is a right angle connector housing with the mating end 744 provided at the front 752 and the cable end 746 provided at the first side 756.

The cable receptacle connector 702 includes signal contacts 770 (one of which is shown in phantom) arranged in the connector cavity 742. The signal contacts 770 extend into the card slot 750 for mating with the mating edge 714 of the mating circuit board 710. The signal contacts 770 are coupled to an interposer assembly 780, such as to an interposer circuit board 782 (shown in phantom) arranged in the connector cavity 742. The cable(s) 760 extends into the connector cavity 742 and is terminated to the interposer circuit board 782. In various embodiments, the interposer assembly 780 includes electronic components mounted to the interposer circuit board 782.

The communication system 700 provides a system architecture wherein the cable connector 702 is coupled directly to the card edge interface of the mating circuit board 710 at the mating edge 714. The communication system 700 eliminates the need for a card edge connector fixedly mounted to the mating circuit board 710. The cables 760 of the cable receptacle connector 702 provide a cost effective and reliable electrical connection with a peripheral device. The cables 760 reduce circuit trace lengths between components of the communication system 700. The cable 760 provides shielded signal paths between the components of the communication system 700. The cable 760 is electrically connected to the mating circuit board 710 through the signal contacts 770 of the cable receptacle connector 702 at a separable mating interface that interfaces directly with the mating circuit board 710. The card slot 750 of the connector housing 740 is configured to directly receive the mating edge 714 of the mating circuit board 710 to electrical connect to the signal contacts 770. The signal contacts 770 are mated to the mating contact pad 720 in the card slot 750 interior of the connector housing 740. In the illustrated embodiment, the signal path between the cable conductor 764 of the cable 760 and the corresponding mating pad 720 has three mating interfaces (the first interface between the cable conductor 764 and the interposer circuit board 782, the second interface between the signal contact 770 and the interposer circuit board 782, and the third interface between the signal contact 770 and the mating pad 720), all of which are located interior of the connector housing 740.

In various embodiments, the mating circuit board 710 is fixed within the communication system 700 and the cable receptacle connector 702 is matable to and unmatable from the mating circuit board 710 without moving the mating circuit board 710 within the communication system 700. In other various embodiments, the cable receptacle connector 702 is fixed within the communication system 700 and the mating circuit board 710 is matable to and unmatable from the cable receptacle connector 702 without moving the cable receptacle connector 702 within the communication system 700.

In an exemplary embodiment, the mating circuit board 710 may be arranged adjacent additional mating circuit board(s) 714, such as in a stacked arrangement, such as at a predetermined pitch or spacing. The stacked mating circuit boards 714 may be coupled together. In an exemplary embodiment, the cable receptacle connector 702 may be arranged adjacent additional cable receptacle connector(s) 702, such as in a stacked arrangement, such as at a predetermined pitch or spacing. The cable receptacle connectors may be ganged together as a connector stack that is coupled to the mating circuit boards 714 simultaneously as a unit.

Figure 8:
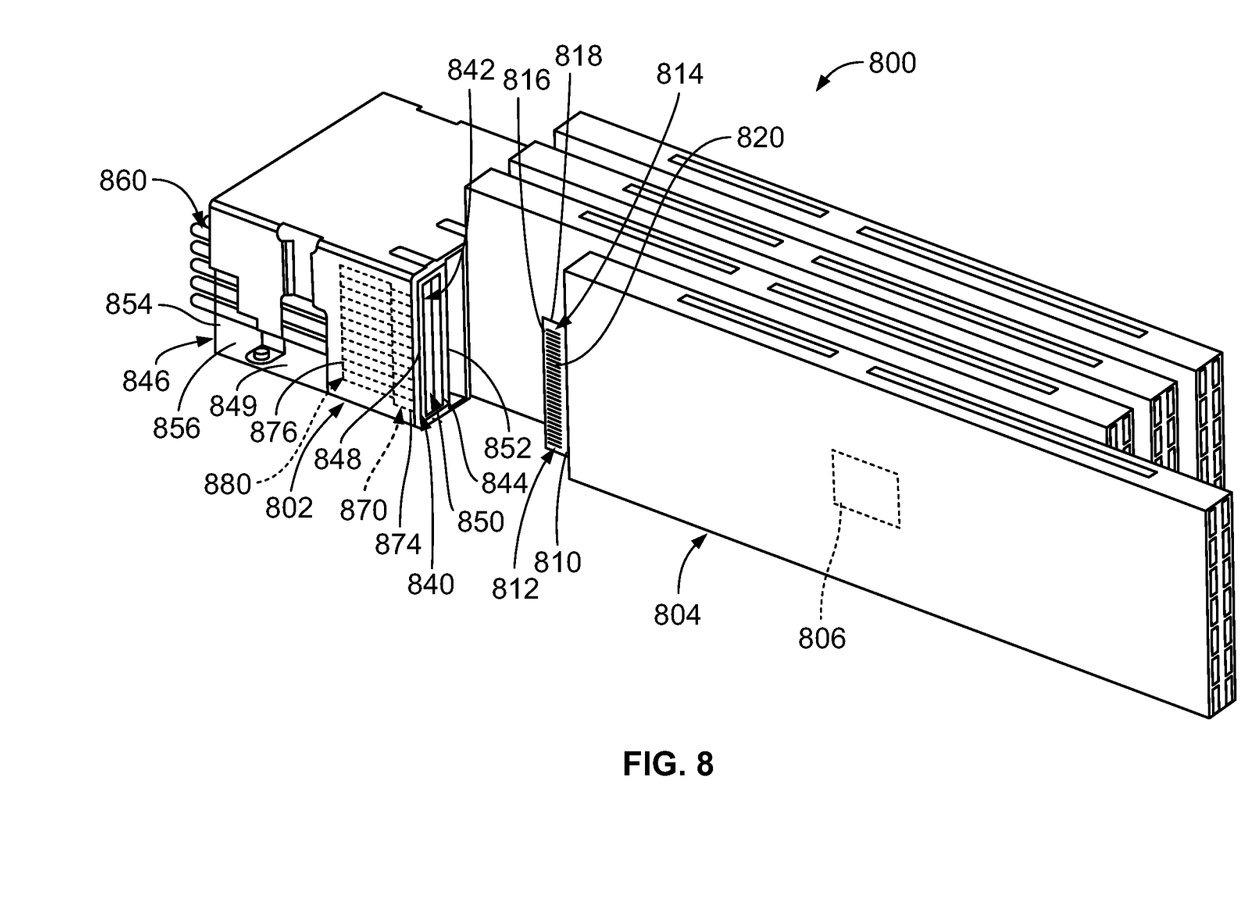
FIG. 8 is a front perspective view of a communication system including a cable receptacle connector in accordance with an exemplary embodiment.

FIG. 8 is a front perspective view of a communication system 800 including a cable receptacle connector 802 in accordance with an exemplary embodiment. The cable receptacle connector 802 is configured to be electrically connected with a circuit board assembly 804. The circuit board assembly 804 may be similar to the circuit board assembly 104 (FIG. 1) and may include similar components and/or features; however the circuit board assembly 804 has a different form factor and may include different electrical components 806. The cable receptacle connector 802 may be similar to the cable receptacle connector 102 (FIG. 1) and may include similar components and/or features; however the cable receptacle connector 802 has a different form factor. The cable receptacle connector 802 is provided without an interposer assembly, rather having the contacts directly terminated to the cables. In various embodiments, the circuit board assembly 804 may be fixed within the communication system 800 and the cable receptacle connector 802 is plugged onto the circuit board assembly 804. In other various embodiments, the cable receptacle connector 802 may be fixed within the communication system 800 and the circuit board assembly 804 is plugged into the cable receptacle connector 804. In the illustrated embodiment, the circuit board assembly 804 is a solid state device (SSD).

The circuit board assembly 804 includes a mating circuit board 810 configured for direct mating with the cable receptacle connector 802. In an exemplary embodiment, the mating circuit board 810 includes a card interface 812 configured to be plugged into the cable receptacle connector 802. The card interface 812 is provided at a mating edge 814 of the mating circuit board 810. The mating edge 814 is sized and shaped to plugged into the cable receptacle connector 802. In an exemplary embodiment, the mating edge 814 defines a card edge that has a standard form factor. In other various embodiments, the mating edge 814 may have a custom or nonstandard form factor.

The mating circuit board 810 has a first surface 816 and a second surface 818 opposite the first surface 816. The mating circuit board 810 includes mating contact pads 820 on the first surface 816 and/or the second surface 818 at the mating edge 814. The cable receptacle connector 802 is configured to be mated to the mating contact pads 820 at the mating edge 814. In an exemplary embodiment, multiple mating circuit boards 810 may be ganged together as a stack, which may coupled to the cable receptacle connectors 802 simultaneously as a unit.

The cable receptacle connector 802 is directly mated with the mating edge 814 of the mating circuit board 810 to electrically connect the circuit board assembly 804 with a remote communication component. The cable receptacle connector 802 is removably coupled to the mating edge 814 of the mating circuit board 810. Direct mating of the mating edge 814 with the cable receptacle connector 802 may eliminate the need for a card edge connector for the cable connector. In an exemplary embodiment, multiple cable receptacle connectors 802 are ganged together as a connector stack, which may coupled to the mating circuit boards 810 simultaneously as a unit.

The cable receptacle connector 802 includes a connector housing 840 having a connector cavity 842 extending between a mating end 844 and a cable end 846 of the connector housing 840. The cable receptacle connector 802 includes one or more cables 860 extending from the cable end 846 of the connector housing 840. The connector housing 840 may be a multipiece housing including a front housing 848 and a rear housing 849. The connector housing 840 includes a card slot 850 at the mating end 844. The card slot 850 is sized and shaped to receive the mating edge 814 of the mating circuit board 810. In an exemplary embodiment, the connector housing 840 includes a front 852 and a rear 854 opposite the front 852. The connector housing 840 includes a first side 856 and a second side 858. In the illustrated embodiment, the mating end 844 is provided at the front 852 and the cable end 846 is provided at the rear 854.

In an exemplary embodiment, the cable receptacle connector 802 includes one or more leadframes 880. The leadframe(s) 880 has a plurality of signal contacts 870 (one of which is shown in phantom) arranged in the connector cavity 842. The signal contacts 870 may be coupled to the connector housing 840 and held in the connector cavity 842 by the connector housing 840. The signal contacts 870 extend into the card slot 850 for mating with the mating edge 814 of the mating circuit board 810. The signal contacts 870 are stamped and formed from a metal sheet defining the leadframe 880. Each signal contact 870 has a main body defined by leads of the leadframe 880 extending between a mating end 874 defining a separable mating interface and a terminating end 876 electrically connected to the corresponding cable conductor of the cable 860. In various embodiments, the terminating ends 876 are terminated directly to the corresponding conductors of the cable 860. For example, the terminating end 876 may be soldered or crimped to the conductor. The rear housing 849 may be overmolded over the leadframe 880 and the ends of the cable 860. The cable receptacle connector 802 may include signal leadframe(s) and ground leadframe(s) having the signal contacts and the ground contacts internested.

The communication system 800 provides a system architecture wherein the cable connector 802 is coupled directly to the card edge interface of the mating circuit board 810 at the mating edge 814. The communication system 800 eliminates the need for a card edge connector fixedly mounted to the mating circuit board 810. The cables 860 of the cable receptacle connector 802 provide a cost effective and reliable electrical connection with a peripheral device. The cables 860 reduce circuit trace lengths between components of the communication system 800. The cable 860 provides shielded signal paths between the components of the communication system 800. The cable 860 is electrically connected to the mating circuit board 810 through the signal contacts 870 of the cable receptacle connector 802 at a separable mating interface that interfaces directly with the mating circuit board 810. The card slot 850 of the connector housing 840 is configured to directly receive the mating edge 814 of the mating circuit board 810 to electrical connect to the signal contacts 870. The signal contacts 870 are mated to the mating contact pad 820 in the card slot 850 interior of the connector housing 840. In the illustrated embodiment, the signal path between the cable conductor 864 of the cable 860 and the corresponding mating pad 820 has two mating interfaces (the first interface between the cable conductor 864 and the leadframe 880, the second interface between the signal contact 870 and the mating pad 820), both of which are located interior of the connector housing 840.

In various embodiments, the mating circuit board 810 is fixed within the communication system 800 and the cable receptacle connector 802 is matable to and unmatable from the mating circuit board 810 without moving the mating circuit board 810 within the communication system 800. In other various embodiments, the cable receptacle connector 802 is fixed within the communication system 800 and the mating circuit board 810 is matable to and unmatable from the cable receptacle connector 802 without moving the cable receptacle connector 802 within the communication system 800.

In an exemplary embodiment, the mating circuit board 810 may be arranged adjacent additional mating circuit board(s) 814, such as in a stacked arrangement, such as at a predetermined pitch or spacing. The stacked mating circuit boards 814 may be coupled together. In an exemplary embodiment, the cable receptacle connector 802 may be arranged adjacent additional cable receptacle connector(s) 802, such as in a stacked arrangement, such as at a predetermined pitch or spacing. The cable receptacle connectors may be ganged together as a connector stack that is coupled to the mating circuit boards 814 simultaneously as a unit.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
    a circuit board assembly including a mating circuit board having a mating edge and a plurality of mating pads at the mating edge, the circuit board assembly having an electrical component electrically coupled to the mating circuit board, the electrical component having a mating interface for mating with a mating electrical component; and
    a cable receptacle connector removably coupled to the mating edge of the mating circuit board, the cable receptacle connector including a connector housing having a connector cavity and a card slot open at a mating end of the connector housing to the connector cavity, the cable receptacle connector including a cable extending from a cable end of the connector housing, the cable receptacle connector including signal contacts arranged in the connector cavity, each signal contact having a mating end and a terminating end, the mating end mated with the corresponding mating pads at the mating edge of the mating circuit board at a separable mating interface, the terminating end electrically connected to a cable conductor of the cable;
    wherein the circuit board assembly is electrically connected to the mating electrical component and the cable receptacle connector at different mating interfaces.

2. The communication system of claim 1, wherein the cable is electrically connected to the mating circuit board through the signal contacts of the cable receptacle connector at the separable mating interface.

3. The communication system of claim 1, wherein the card slot of the connector housing directly receives the mating edge of the mating circuit board to electrical connect to the signal contacts interior of the connector housing.

4. The communication system of claim 1, wherein a signal path between the cable conductor of the cable and the corresponding mating pad has two mating interfaces which are both located interior of the connector housing.

5. The communication system of claim 1, wherein a signal path between the cable conductor of the cable and the corresponding mating pad has three mating interfaces each of which are located interior of the connector housing.

6. The communication system of claim 1, wherein the mating circuit board is fixed within the communication system, the cable receptacle connector being matable to and unmatable from the mating circuit board without moving the mating circuit board within the communication system.

7. The communication system of claim 1, wherein the cable receptacle connector is fixed within the communication system, the mating circuit board being matable to and unmatable from the cable receptacle connector without moving the cable receptacle connector within the communication system.

8. The communication system of claim 1, wherein the cable receptacle connector includes an interposer circuit board arranged in the connector cavity, the cable extending into the connector cavity and being terminated to the interposer circuit board interior of the connector housing, the signal contacts being terminated to the interposer circuit board and being electrically connected to the cable via circuit traces of the interposer circuit board, the signal contacts extending from the interposer circuit board into the card slot for mating with the corresponding mating pads at the mating edge of the mating circuit board.

9. The communication system of claim 8, wherein the interposer circuit board extends between a front edge and a rear edge, the signal contacts extending from the front edge, the cable being terminated to the rear edge, the interposer circuit board being arranged in the connector cavity such that the front edge and the rear edge are interior of the connector housing.

10. The communication system of claim 8, wherein the cable receptacle connector includes electronic components mounted to the interposer circuit board, the electronic components being electrically connected to the corresponding signal contacts.

11. The communication system of claim 1, wherein the cable receptacle connector includes a signal leadframe including the signal contacts being stamped from a metal sheet, each signal contact having a signal lead extending between the mating end and the terminating end.

12. The communication system of claim 11, wherein the signal contact includes a deflectable mating beam at the mating end and a solder pad at the terminating end, the signal lead, the mating beam and the terminating end being integral as a common signal contact.

13. The communication system of claim 11, wherein the cable receptacle connector includes a ground leadframe including ground contacts interspersed with the signal contacts.

14. The communication system of claim 1, wherein the mating edge has a standard form factor.

15. The communication system of claim 14, wherein the standard form factor of the mating edge is a form factor conforming to a PCI-e standard.

16. The communication system of claim 1, wherein the mating circuit board is a first mating circuit board and wherein the cable receptacle connector is a first cable receptacle connector, the communication system further comprising a second mating circuit board having a second mating edge and a plurality of mating pads at the second mating edge, the communication system further comprising a second cable receptacle connector removably coupled to the second mating edge of the second mating circuit board, the first cable receptacle connector and the second cable receptacle connector being ganged together as a connector stack, the connector stack being coupled to the first and second mating circuit boards such that the first cable receptacle connector is coupled to the first mating circuit board and the second cable receptacle connector is coupled to the second mating circuit board.

17. A communication system comprising:
   a circuit board assembly including a mating circuit board having a mating edge and a plurality of mating pads at the mating edge, the circuit board assembly having an electrical component electrically coupled to the mating circuit board, the electrical component having a mating interface for mating with a mating electrical component; and
   a cable receptacle connector removably coupled to the mating edge of the mating circuit board, the cable receptacle connector including a connector housing having a connector cavity and a card slot open at a mating end of the connector housing to the connector cavity, the cable receptacle connector including an interposer circuit board arranged in the connector cavity, the cable receptacle connector including a cable extending into the connector cavity being terminated to the interposer circuit board, the cable extending from a cable end of the connector housing, the cable receptacle connector includes signal contacts terminated to the interposer circuit board being electrically connected to the cable, the signal contacts extending from the interposer circuit board into the card slot for mating with the corresponding mating pads at the mating edge of the mating circuit board at a separable mating interface;
   wherein the circuit board assembly is electrically connected to the mating electrical component and the cable receptacle connector at different mating interfaces.

18. The communication system of claim 17, wherein the card slot of the connector housing directly receives the mating edge of the mating circuit board to electrical connect to the signal contacts interior of the connector housing.

19. The communication system of claim 17, wherein a signal path between the cable conductor of the cable and the corresponding mating pad has two mating interfaces which are both located interior of the connector housing.

20. A communication system comprising:
   a circuit board assembly including a mating circuit board having a mating edge and a plurality of mating pads at the mating edge, the circuit board assembly having an electrical component electrically coupled to the mating circuit board, the electrical component having a mating interface for mating with a mating electrical component; and
   a cable receptacle connector removably coupled to the mating edge of the mating circuit board, the cable receptacle connector including a connector housing having a connector cavity and a card slot open at a mating end of the connector housing to the connector cavity, the cable receptacle connector including a signal leadframe including signal contacts being stamped from a metal sheet, each signal contact having a signal lead extending between a mating end and a terminating end, the mating end extending into the card slot for mating with the corresponding mating pads at the mating edge of the mating circuit board at a separable mating interface, the terminating end being electrically connected to a cable conductor of the cable, the cable extending from a cable end of the connector housing;
   wherein the circuit board assembly is electrically connected to the mating electrical component and the cable receptacle connector at different mating interfaces.

\* \* \* \* \*